(12) United States Patent
Pekny et al.

(10) Patent No.: US 6,477,082 B2
(45) Date of Patent: Nov. 5, 2002

(54) BURST ACCESS MEMORY WITH ZERO WAIT STATES

(75) Inventors: Theodore T. Pekny, Campbell, CA (US); Stephen J. Gualandri, Campbell, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/751,688

(22) Filed: Dec. 29, 2000

(65) Prior Publication Data

US 2002/0085417 A1 Jul. 4, 2002

(51) Int. Cl.[7] ............................................. G11C 11/34
(52) U.S. Cl. .............................. 365/185.11; 365/230.06
(58) Field of Search ........................ 365/185.11, 230.06

(56) References Cited

U.S. PATENT DOCUMENTS

| | | | |
|---|---|---|---|
| 5,315,548 A | * 5/1994 | Ooishi et al. | 365/189.01 |
| 5,493,535 A | * 2/1996 | Cho | 365/230.04 |
| 5,502,675 A | * 3/1996 | Kohno et al. | 365/200 |
| 5,625,790 A | 4/1997 | Cutter | 395/431 |
| 5,666,321 A | 9/1997 | Schaefer | 365/233.5 |
| 5,691,951 A | 11/1997 | Rupp | 365/230.06 |
| 5,751,656 A | 5/1998 | Schaefer | 365/233.5 |
| 5,835,441 A | 11/1998 | Seyyedy et al. | 365/230.06 |
| 5,845,315 A | 12/1998 | Cutter | 711/104 |
| 5,898,638 A | 4/1999 | Keeth | 365/230.06 |
| 5,912,860 A | 6/1999 | Schaefer | 365/233.5 |
| 5,923,604 A | 7/1999 | Wright et al. | 365/230.06 |
| 5,953,269 A | 9/1999 | Manning | 365/200 |
| 5,978,309 A | 11/1999 | Seyyedy et al. | 365/230.06 |
| 5,991,225 A | 11/1999 | Forbes et al. | 365/230.06 |
| 5,999,480 A | 12/1999 | Ong et al. | 365/230.06 |
| 6,026,046 A | 2/2000 | Larson | 365/230.06 |
| 6,046,958 A | 4/2000 | Keeth | 365/230.08 |
| 6,049,502 A | * 4/2000 | Cowles et al. | 365/230.03 |
| 6,084,818 A | * 7/2000 | Ooishi et al. | 365/230.03 |
| 6,108,251 A | 8/2000 | Manning | 365/200 |
| 6,111,814 A | 8/2000 | Schaefer | 365/233.5 |
| 6,115,314 A | 9/2000 | Wright et al. | 365/230.02 |
| 6,130,843 A | 10/2000 | Lee | 365/189.05 |
| 6,130,855 A | 10/2000 | Keeth | 365/230.08 |
| 6,153,468 A | 11/2000 | Forbes et al. | 438/257 |
| 6,205,080 B1 | * 3/2001 | Seyyedy et al. | 365/230.06 |
| 6,219,299 B1 | 4/2001 | Forbes et al. | 365/230.06 |
| 6,222,788 B1 | 4/2001 | Forbes et al. | 365/230.06 |
| 6,304,510 B1 | * 10/2001 | Nobunaga et al. | 365/230.06 |

* cited by examiner

*Primary Examiner*—M. Tran
(74) *Attorney, Agent, or Firm*—Fogg Slifer Polglaze Leffert & Jay P.A.

(57) ABSTRACT

A memory device has a segmented memory cell array that take a row address and a column address and allows for data words in a column page to be read internally in parallel for faster access. The memory device employs a segmented memory array that routes column address and column address+1 to the segments. This allows for a random starting data word in the column page, while the data words in the next column page (column address+1) are loaded into the memory array segments before the starting data word. When the data page mode or linear burst access crosses a column address boundary the next data words in column address+1 are available and no wait states need to be asserted to allow for new column address values to propagate.

80 Claims, 10 Drawing Sheets

| Starting Segment | Segment 0 | Segment 1 | Segment 2 | Segment x-1 | Segment x |
|---|---|---|---|---|---|
| 0 | Col. Add | Col. Add | Col. Add | Col. Add | Col. Add |
| 1 | Col. Add+1 | Col. Add | Col. Add | Col. Add | Col. Add |
| 2 | Col. Add+1 | Col. Add+1 | Col. Add | Col. Add | Col. Add |
| 3 | Col. Add+1 | Col. Add+1 | Col. Add+1 | Col. Add | Col. Add |
|  |  |  |  |  |  |
|  |  |  |  |  |  |
| x-1 | Col. Add+1 | Col. Add+1 | Col. Add+1 | Col. Add | Col. Add |
| x | Col. Add+1 | Col. Add+1 | Col. Add+1 | Col. Add+1 | Col. Add |

BURST ACCESS MEMORY WITH ZERO WAIT STATES

TECHNICAL FIELD OF THE INVENTION

The present invention relates generally to integrated circuits and in particular the present invention relates to memory devices with burst read access.

BACKGROUND OF THE INVENTION

Integrated circuit memory devices are available in numerous configurations. For example, volatile and non-volatile memory devices are commonly implemented. In addition, numerous methods of reading and writing to memory devices are known to those skilled in the art.

Random access memory devices have memory cells that are typically arranged in rows and columns. During operation, a row (page) is accessed and then memory cells can be randomly accessed on the page by providing column addresses. This access mode is referred to as page mode access. To read or write to multiple column locations on a page requires the external application of multiple column addresses. To increase access time, a burst mode access has been implemented. The burst mode uses an internal column address counter circuit to generate additional column addresses. The address counter begins at an externally provided address and advances in response to an external clock signal (synchronous memory) or a column address strobe signal (non-synchronous memory).

Different architectures of memory devices have also been implemented to decrease the time period between output data. One architecture uses multiple array segments. Each array segment is used to read a memory column(s) simultaneously. Data from one of the memory segments is then selected for output. The remaining segments can then be output sequentially in response to subsequent clock cycles.

Figure 1:
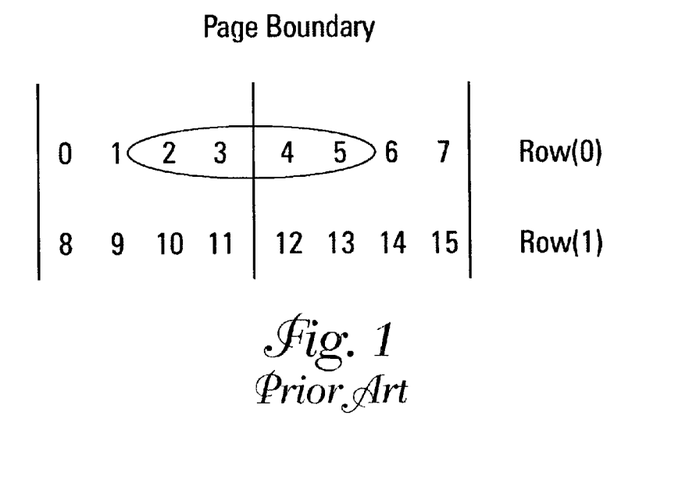
FIG. 1 illustrates data word locations in a prior art memory.
Figure 2:
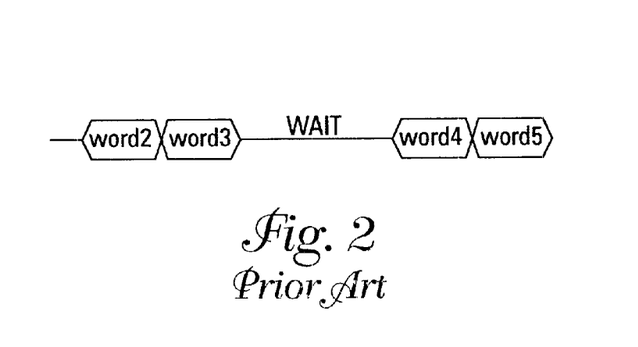
FIG. 2 is a diagram of a page mode access in a memory of FIG. 1 that cross a column page boundary in a segmented memory showing inserted wait states.
Figure 3:
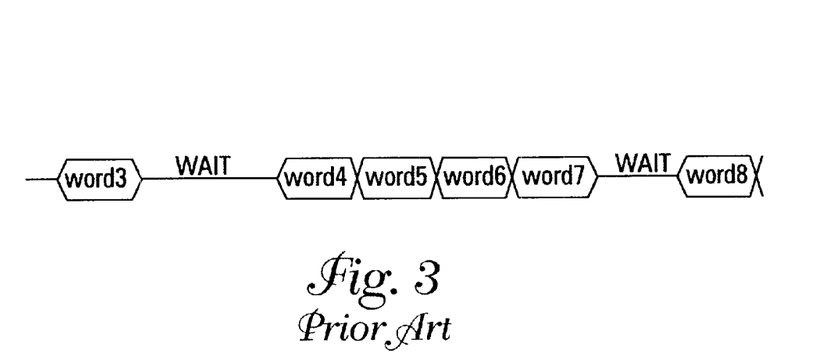
FIG. 3 is a diagram of a linear burst access in a memory of FIG. 1 that crosses both a column page and a row boundary, showing inserted wait states.

In operation, a common row address for the memory segments is accessed. In addition, a common column address is used to select a column from each segment. It will be appreciated that the memory array can be viewed as three-dimensional. That is, each segment can be X-bits deep to provide a data word having length-X in response to a single row and column address. The above architecture allows for fast output of data from the selected column of each array segment. However, when different column data is required from some of the segments, a clock Wait state is required. That is, the memory needs time to access and read data from a different memory array column. Each column address in the array segments defines a page boundary. For example, in a memory device having four array segments, a page boundary is encountered every four data word, see FIG. 1. In FIG. 1, data locations 0, 1, 2 and 3 are located in four different segments but have the same column address in each segment (column address A1). Likewise, data locations 4, 5, 6 and 7 are located in the four different segments but have the same column address in each segment (column address A2). Thus, to read data words 2, 3, 4 and 5 a page boundary must be crossed and the column address incremented. FIG. 2, illustrates the output of data words 2, 3, 4 and 5. Note that a wait state is required between data words 3 and 4. Likewise, a linear burst output that crosses rows requires additional wait states as illustrated in FIG. 3.

For the reasons stated above, and for other reasons stated below which will become apparent to those skilled in the art upon reading and understanding the present specification, there is a need in the art for a system to reduce wait states in burst mode accesses in a memory device.

SUMMARY OF THE INVENTION

The above-mentioned problems with memories and other problems are addressed by the present invention and will be understood by reading and studying the following specification.

In one embodiment, a memory device comprises a memory array with a plurality of array partitions, a first address circuit, a second address circuit, and a control circuit to independently couple either the first address circuit or the second address circuit to each of the plurality of array partitions.

In another embodiment, a memory device comprises, a memory array with a plurality of divisions, a row address circuit, a first column address circuit to provide a first address output, a second column address circuit to provide a second address output, a plurality of column decode circuits, and a control circuit to selectively couple either the first column address circuit or the second column address circuit to the individual column decode circuits.

A method for accessing a partitioned memory array comprises acquiring a first memory address, generating a second memory address, determining an address that is required by each of the individual memory array partitions, and coupling either the first memory address or the second memory address to the individual memory array segments.

Another method for accessing a partitioned memory array comprises acquiring a row address, acquiring a first column address, generating a second column address, and selectively coupling the first column address or the second column address to the individual memory array partitions.

In an additional embodiment, a memory system comprises an external processor, and a non-volatile memory coupled to the external processor. The non-volatile memory comprises, a memory array with a plurality of segments, a row address circuit, a first column address circuit to provide a first address output, a second column address circuit to provide a second address output, a plurality of column decode circuits, and a control circuit to selectively couple either the first column address circuit or the second column address circuit to the individual column decode circuits.

In yet another embodiment, a memory device comprises a memory array with a plurality of segments, a row address circuit, a first column address circuit to provide a first address output, a second column address circuit to provide a second address output, and a plurality of column decode circuits, wherein the first address output is coupled to at least one of the plurality of column decode circuits and the second address output is coupled the remainder of the column decode circuits.

In a further embodiment, a non-volatile memory device comprises a memory array with a plurality of segments, a column decode circuit coupled to a plurality of bit lines of the memory array, an address decode circuit to receive an external column address, a column address counter circuit to provide an internal column address, and a multiplexer circuit to receive outputs from both the address decode circuit and the column address counter circuit, wherein the output of the multiplexer circuit is coupled to the column decode circuit, and where the multiplexer is controlled in response to an externally provided segment starting address.

DETAILED DESCRIPTION OF THE INVENTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 4:
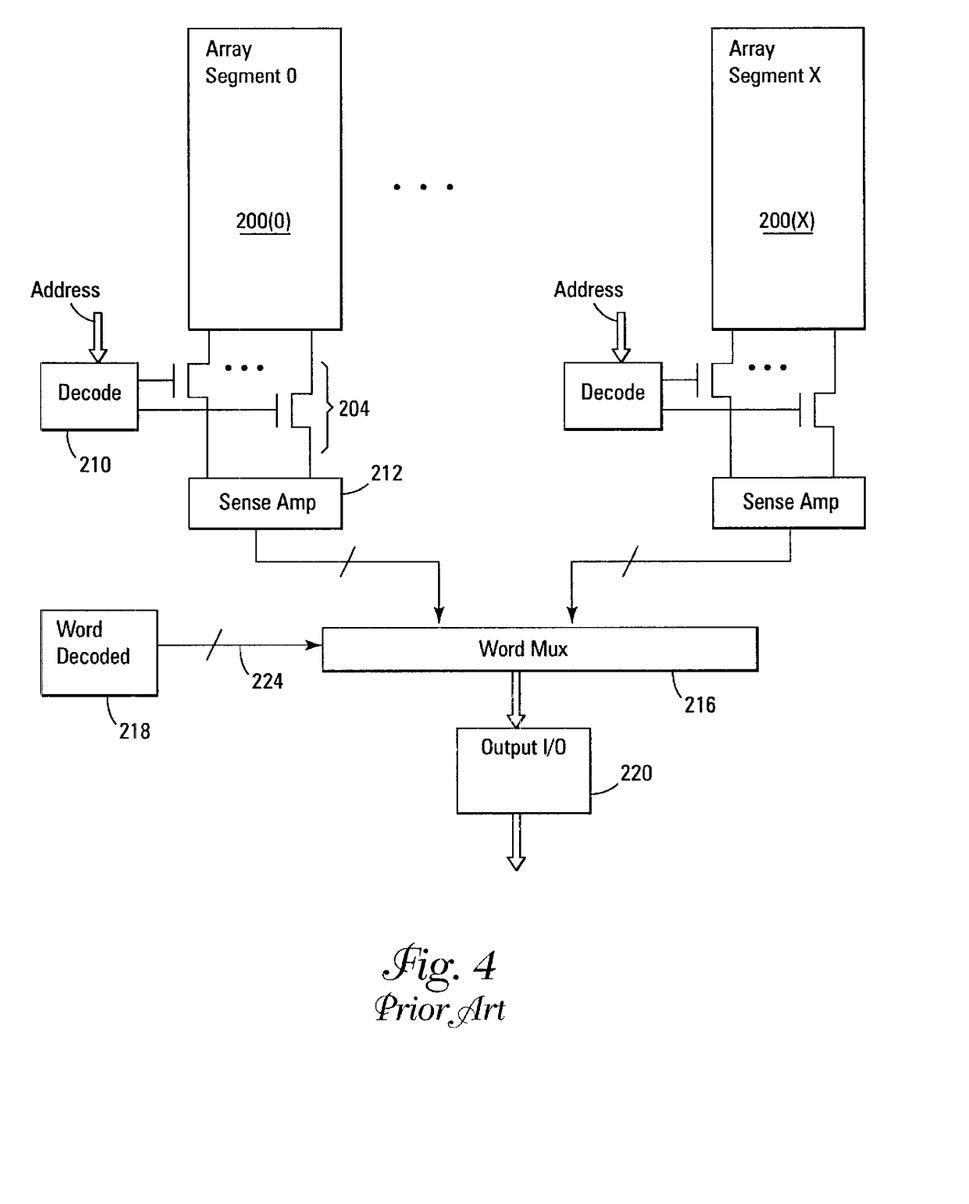
FIG. 4 is a simplified block diagram of a prior art segmented memory array of X segments.

Shown in FIG. 4 is a simplified prior art segmented memory device array. The array of FIG. 4 contains X segments 200(0)–(X) to allow for X data words to be read in parallel on a given column page and single row address. X is typically chosen to be a power of 2, such that $X=2^M$. A top plane of the memory array segments is illustrated. The depth of the memory array segments, however, defines the length of the data word.

The memory array segments are coupled to column select, or pass, transistors 204 controlled by segment column decoder circuitry 210. The column decode circuitry activates the select transistors in response to a column address. Each column decode circuitry for each segment receives the same column address. The select transistors are coupled to sense amplifier circuitry 212. Word multiplex circuitry 216 is coupled to the sense amplifier circuitry to selectively route a word from an array segment to output circuitry 220 in response to a word decoder 218.

In operation, when a memory access is requested, a row is selected across all X memory segments by row address register and row decode circuits (not shown). The memory cells of the selected row are accessed and couple data to column bit lines. The bit lines to be read by the sense amplifiers are selected by the column decoders 210 via pass transistors 204 from a column address that has been latched into a column address register (not shown). The values of the selected bit lines are read by sense amplifiers 212 for each array segment.

Word select lines 224 select an array segment and associated data word via multiplex circuitry 216. The multiplex circuitry is controlled by an externally provided address signal(s). Each sense amplifier circuitry senses a data word for each segment. These words can be output by changing the word address used to control the multiplex circuitry. The word address is typically incremented internally by the memory.

As explained above, the data words in the sense amplifier circuitry establish a page boundary and crossing the boundary requires a wait state to sense data in a different column of the segments. Given a random starting, there is an average of X/2 data words transferred before a wait state may be asserted for a column change. The best case data transfer before a wait state must be asserted is when a burst read begins at a page boundary. The worst case is when a burst read begins at the last data word of a column page. If a row boundary is crossed both the row address and the column address are changed and wait states inserted to allow signals to propagate.

The present invention provides a memory and method of reading data without requiring a wait state when a page boundary is crossed. As explained below, the memory can selectively route different column addresses to memory array segments. This allows data from different column address to be read from different segment columns.

Figure 5:
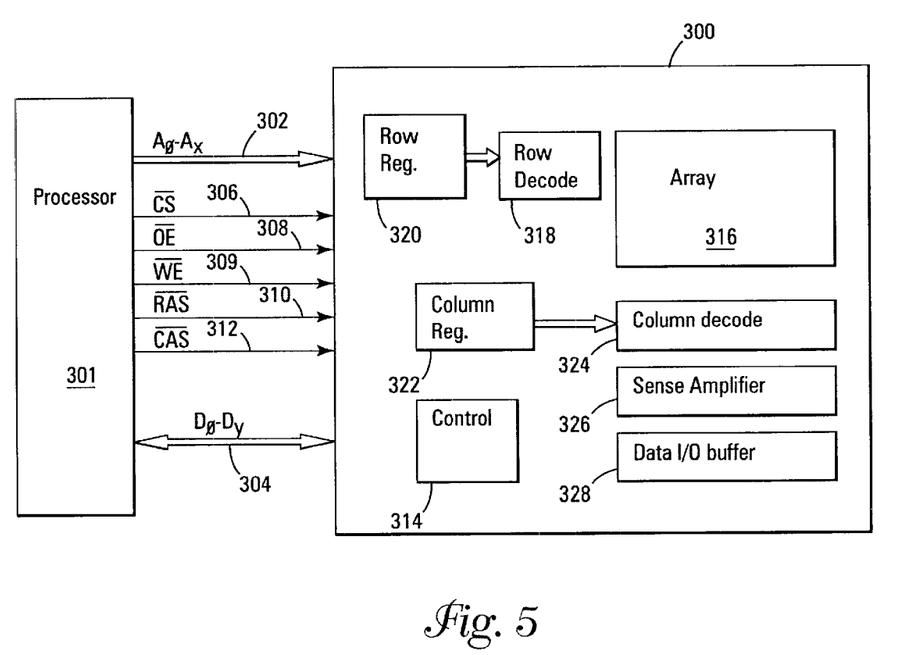
FIG. 5 is a simplified block diagram of a memory of an embodiment of the present invention.
Figure 6:
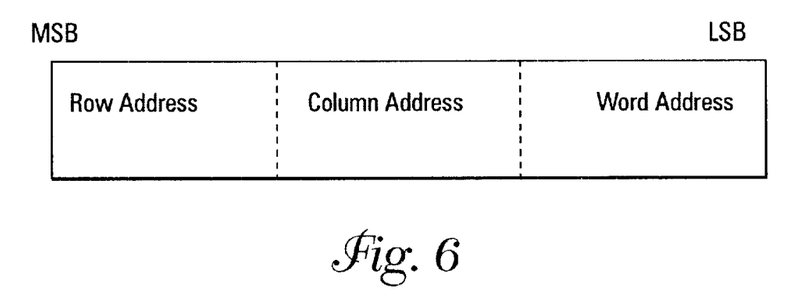
FIG. 6 illustrates externally received address decoding assignments.

Shown in FIG. 5 is a memory device 300 of an embodiment of the present invention illustrating external interface connections coupled to a processor 301. Address lines $A_0$–$A_X$ 302 are utilized to transfer addressing information to the memory device to access specific addresses. Data lines $D_0$–$D_Y$ 304 are utilized to transfer data words to the memory device during a write operation and to retrieve the selected data words from the memory device in a write operation. The active low signal /CS 306, chip select, is utilized to select the memory device and put it in an active mode. The active low signal /OE 308, output enable, is used to enable the data output of data lines, $D_0$–$D_Y$ 304, the memory device so that it can output the retrieved data in a read cycle. The active low signal /WE 304, write enable, is used to signal a data write operation to the memory device and place the data lines, $D_0$–$D_Y$, into input mode. The active low strobe signal /RAS 310, row address strobe, latches the address which has been placed on $A_0$–$A_X$ into an internal row address register of the memory device in preparation for a read or write operation. The active low strobe signal /CAS 312, column address strobe, latches the column address from $A_0$–$A_X$ into an internal column address register in the memory device. Address signals provided on $A_0$–$A_X$ are used to identify a Row, Column and Word address. In one embodiment, most significant address bits identify the Row, and the least significant portion of the input address bits identify the word address, see FIG. 6.

The memory includes an array 316 having individual memory cells arranged in a matrix of rows and columns. Individual memory cells are coupled to a row word line and to bit lines. A control circuit/state machine 314 receives control signals (/WE, /OE, /CS, /RAS, and /CAS) and directs internal operation of the memory device. The row address register 320 latches a row address from the address lines $A_0$–$A_X$ when the memory device is strobed by /RAS. A row address from row address register 320 is used by the row address decoder 318 to select a row from memory array 316. Memory cells of a selected row provide data to column bit lines. Column address register 322 latches an address from address lines $A_0$–$A_X$ when the memory device is strobed by /CAS. The column address decoder 324 utilizes the latched column address to select the column bit lines from the memory array 316.

For a read operation the selected column bit lines are coupled to sense amplifiers 326 to be read. The output of the sense amplifier circuitry is coupled to data I/O buffer 328 to be output on the data lines, $D_0$–$D_Y$. The memory architecture and control signal inputs of FIG. 5 has been simplified to focus on the features needed to describe the present invention. Thus, those skilled in the art will appreciate that the schematic diagram has been simplified to focus on the present invention and that the control lines, busses, and internal architecture may be implemented differently.

Figure 7:
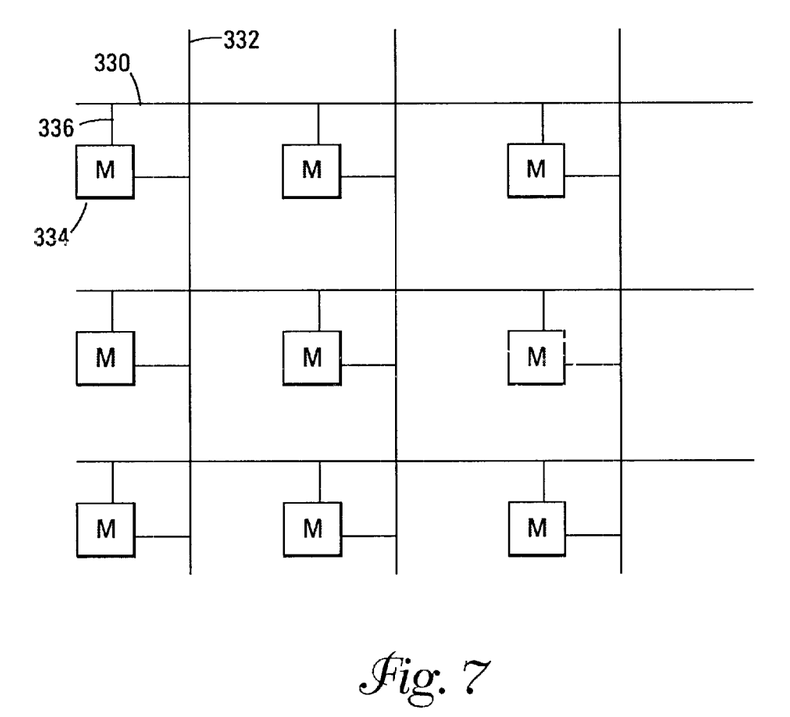
FIG. 7 illustrates a portion of a memory array of the memory of FIG. 5.

A detailed illustration of a portion of memory array 316 is illustrated in FIG. 7. Memory cells 334 are arranged in a plurality of rows and columns. In the memory array each memory cell 334 in a column are connected to a bit line 332. In addition, a control input 336 of each memory cell 334 in a row is connected to a word line 330. The appropriate word line 330 for the desired memory address is selected and the values for the row are expressed onto the coupled bit lines 332. The bit line 332 is connected (not shown) to a sense amplifier/comparator that detects the bit value stored in the memory cell. The array of FIG. 7 has been simplified to illustrate the basic arrangement of memory cells and bit lines. Those skilled in the art will appreciate that the schematic diagram has been simplified to focus on the present invention and that additional rows and columns would be implemented to create a complete memory device with a specific memory cell technology.

Figure 8:
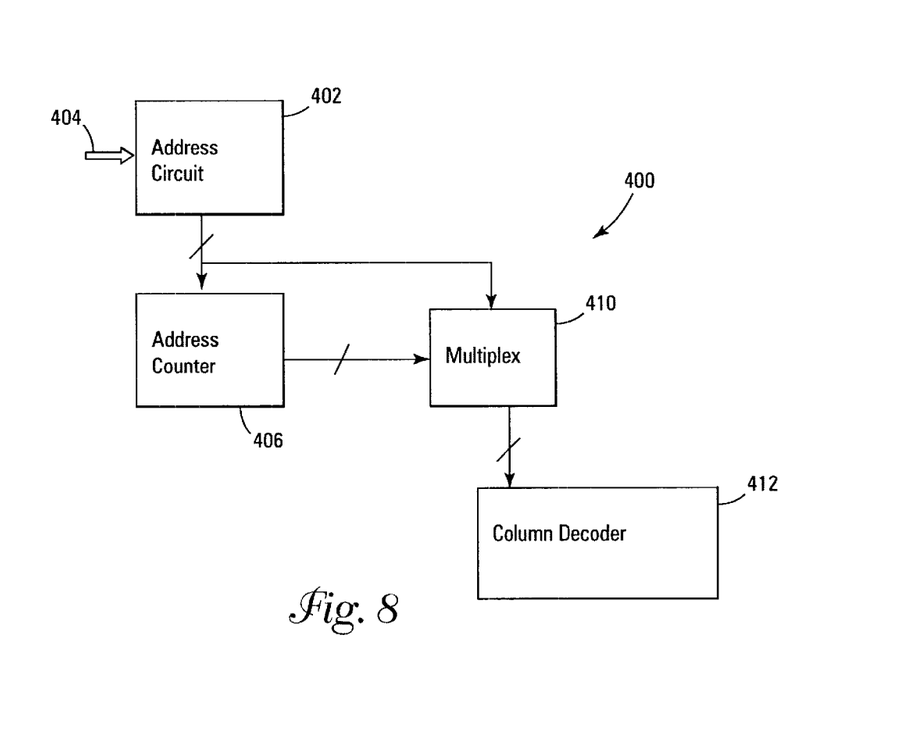
FIG. 8 is a block diagram of addressing circuitry of an embodiment of the present invention.

FIG. 8 illustrates address circuitry 400 of an embodiment of the present invention. The address circuitry includes a column address circuit 402 to decode externally provided column addresses 404. A column address counter circuit 406 is provided to generate a column address based upon the output of the column decode circuit. The column counter provides an incremented column address (Address+1) output. The outputs of the two address circuits are coupled to a multiplex circuit 410. The output of the multiplex circuit is routed to column decode circuitry 412. The column decode circuitry is used to selectively couple data output from the memory array, as explained below. Address circuit 402 and counter 406 are generally illustrated as circuit 322 in FIG. 5.

Figure 9:
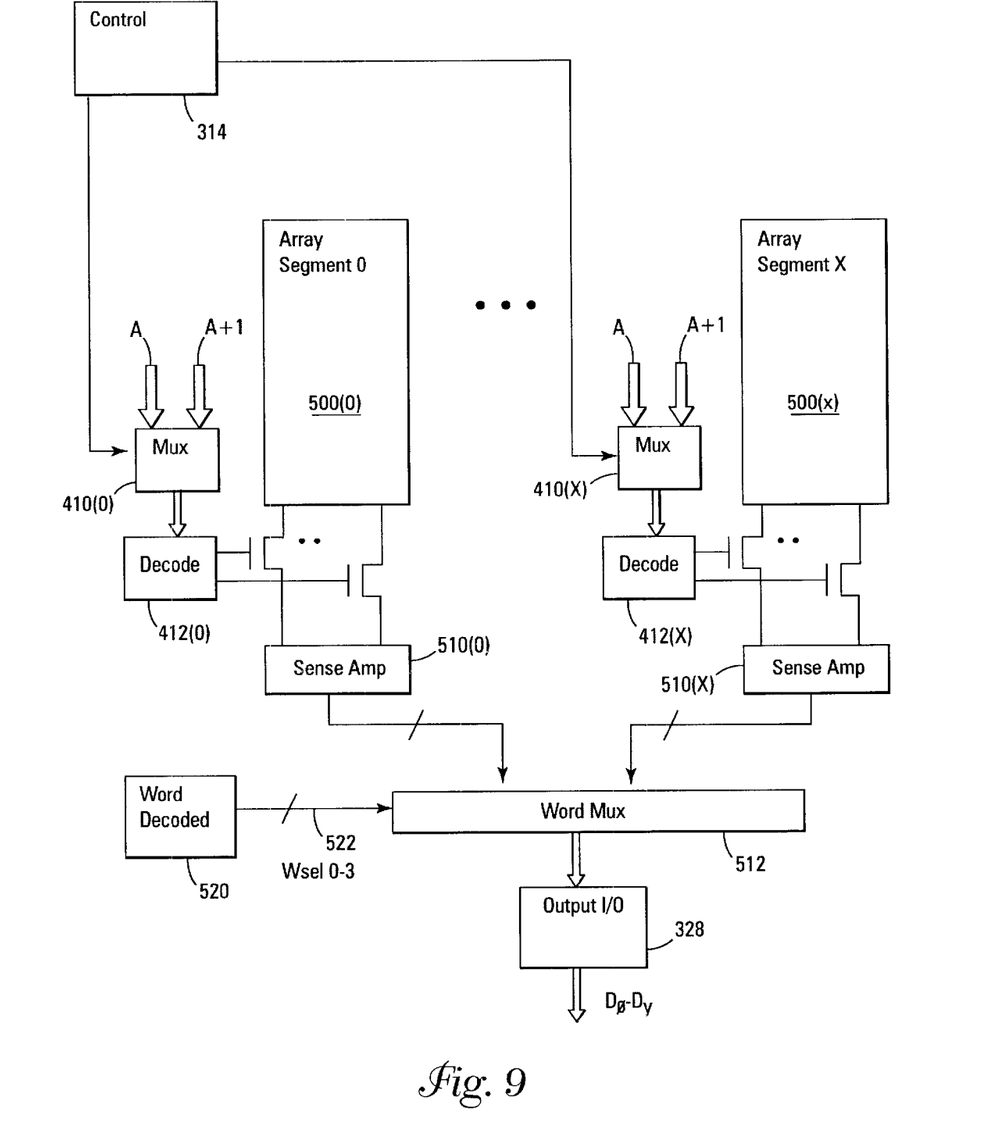
FIG. 9 is a simplified block diagram of the segmented memory array of the memory of FIG. 5.

Shown in FIG. 9 is more detailed illustration of a portion of a memory device of the present invention. The memory device includes an array of memory cells that is divided into segments 500(0)–500(x). The array of FIG. 9, contains X segments to allow for X data words to be read in parallel on a given column page and single row address. A top plane of the memory array segments are illustrated. The depth of the memory array segments, however, defines the length of the data word.

The segmented memory device array of FIG. 9 additionally has two column address values (A, A+1) available to the column address decoders 512. The column address (either column address or column address+1) that is to be used by the individual array segments is chosen by the column address multiplexers 410 under control of the control circuit/state machine 314. The availability of both column address and column address+1 to the individual segment arrays allows for page mode and linear burst data accesses that do not experience wait state delays crossing column page boundaries.

In operation, when a memory access is requested, a row is selected across all X memory segments by the row address register 320 and decode circuits 318. The memory cells of the selected row are coupled to column bit lines. Selected common bit lines to be read are selected by the segment column decoders 412 which have either column address or column address+1 coupled to them from the column address multiplexers 410. The individual column bit lines are selected by the segment column address decoder 412 via pass transistors 502. The data values of the selected bit lines are read by sense amplifiers 416 for each segment.

Word select lines 522 (wsel0-3), generated from the input address signals, select one of the segments to read a data word. The active word select is determined initially by the value of the word address register that contains the least significant portion of the column address. The mulitplexer 410(0)–410(x) that is selected outputs its data word to the data output buffer 328 of the memory device. The column address that is coupled to the column address decoder 412 by the column address multiplexer 410 (column address or column address+1) is determined by the control circuit/state machine of the memory device by the starting data word of the data access.

Figure 10:
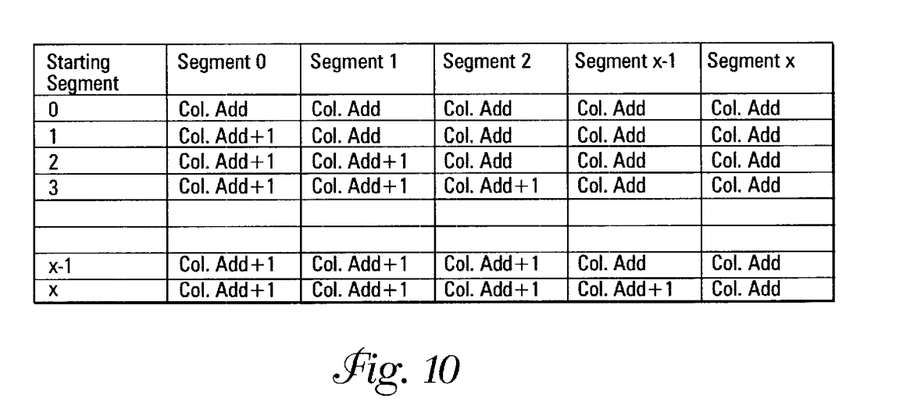
FIG. 10 is a sample table of multiplex outputs for each segment of an array of the memory of FIG. 9.

A table of segment column addresses generated from the starting data word in a column page 434 is shown in FIG. 10. From this table is noted that the final segment in an array of X segments will never need to use column address+1 as it will always be on the current column page as the starting data word address. As a result, in one embodiment, the final segment (segment 500(x) of FIG. 15) only requires the column address and does not need the column address+1 or a column address multiplexer 410(x).

In a linear burst or a page mode data transfer, memory array segments with a data word address equal or higher than the starting data word are assigned a column address through their column address multiplexers 410 and retrieve data words from the current column page (current column address) through the column decoders 412 into the sense amplifiers 510. Memory array segments with a data word address that is less than the starting data word address are assigned the column address+1 from the column address multiplexers 410 and retrieve data words from the next column page of data words (column address+1). This arrangement allows the data words on the other side of the column page boundary to be available immediately, where a wait state would normally need to be asserted to access them. This obviates the need for wait state(s) at the column page boundary while the data signals propagate for the next column page of data words.

Figure 11:
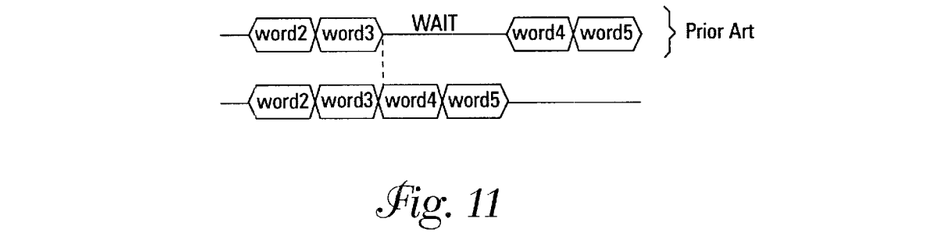
FIG. 11 is a diagram showing a comparison of burst read operations that cross a column page boundary of the memory of FIG. 4 to the memory of FIG. 5.
Figure 12:
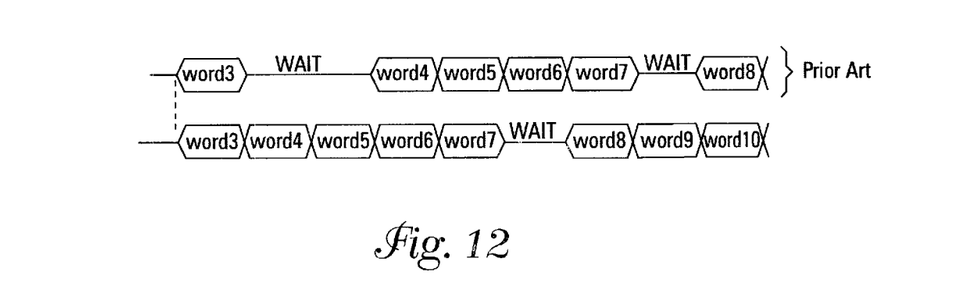
FIG. 12 is a diagram showing a comparison of burst read operations that cross a column page boundary and a row boundary of the memory of FIG. 4 to the memory of FIG. 5.

A comparison of read accesses of a prior art segmented memory array of four segments and a segmented memory array of four segments of an embodiment of the present invention are shown in FIGS. 11 and 12. Shown in FIG. 11 illustrates memory read accesses that cross a column page boundary. A four-word memory access begins on word address two and crosses a column page boundary after the second data word accessed and ends with word five. The 4 data word page mode access utilizing a prior art segmented memory array includes a wait state inserted after the second data word accessed as the page boundary is crossed. The same 4 data word page mode access is shown using a segmented array of the present invention without a wait state.

A comparison of a linear burst access of greater than four data words that starts at data word two and crosses a column page boundary is shown in FIG. 12. With a linear burst access the traditional segmented memory array transfer inserts a wait state after the second data word accessed. In contrast, the linear burst access of a memory device containing a segmented memory array of the present invention contains no wait states.

Figure 13:
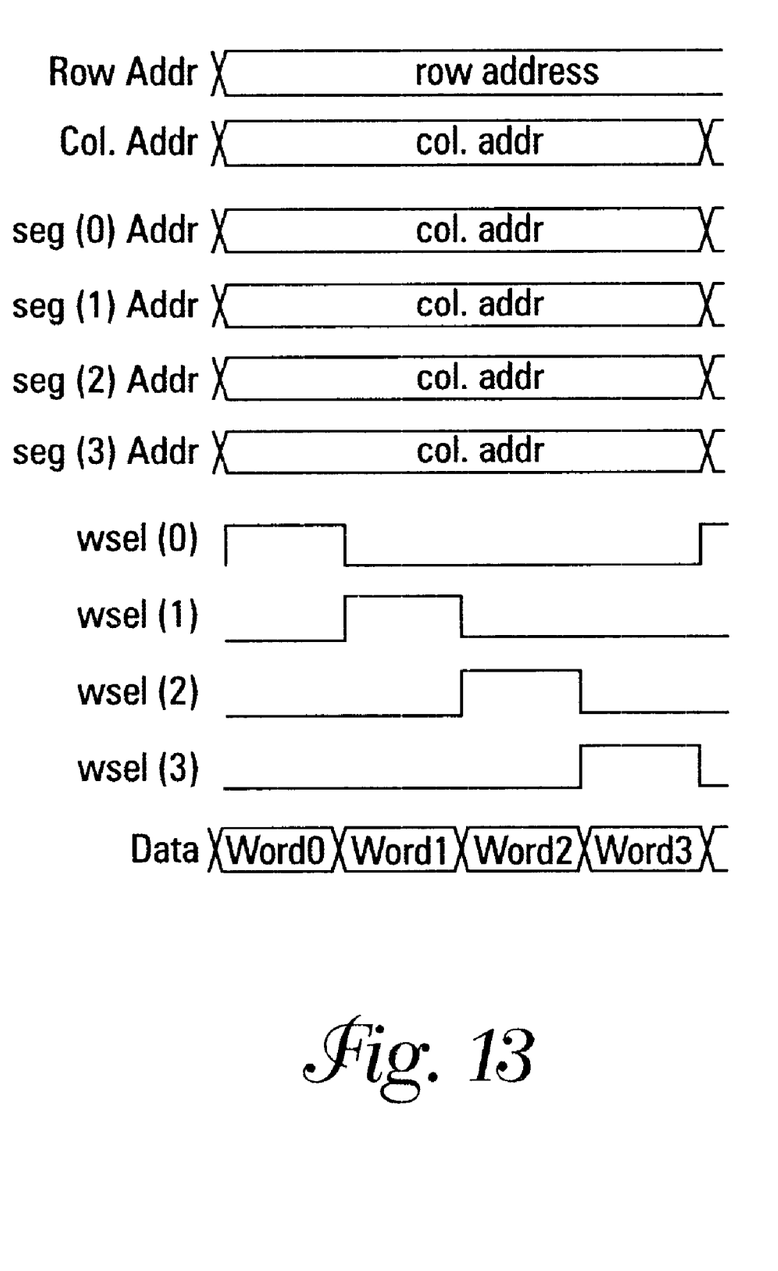
FIG. 13 is a timing diagram of a four word burst read of the memory of FIG. 5.
Figure 14:
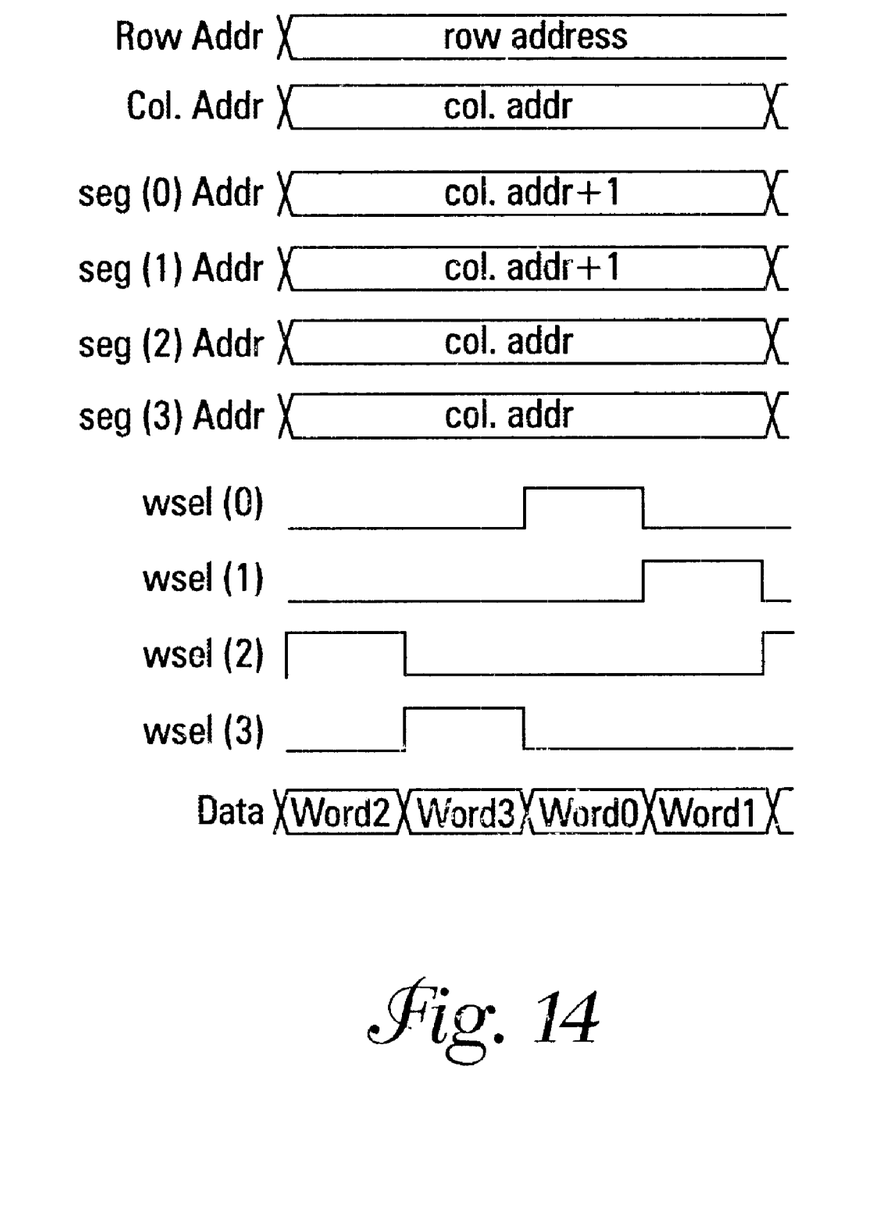
FIG. 14 is another timing diagram of a four word burst read of the memory of FIG. 5.
Figure 15:
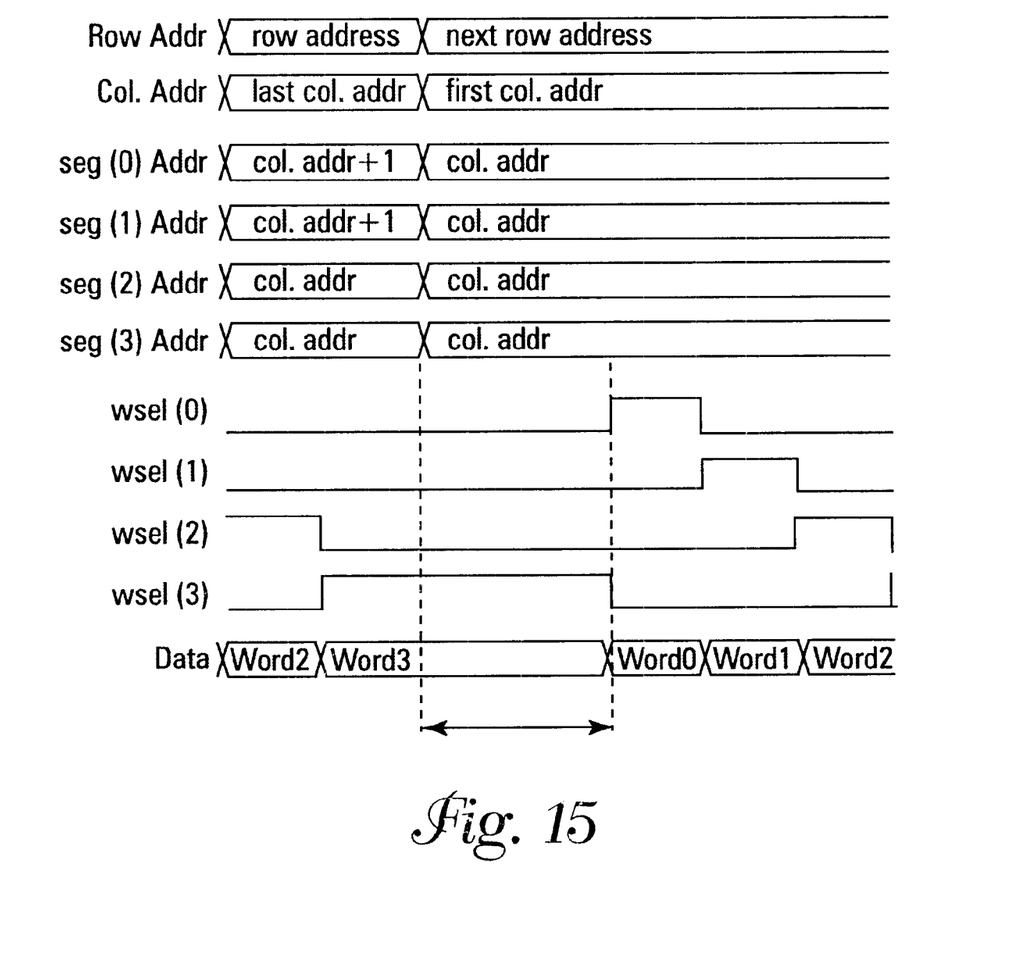
FIG. 15 is a timing diagram of a burst read of the memory of FIG. 5 that crosses a row boundary.

Example timing diagrams of burst read operations from a four-segment memory array of the present invention are illustrated in FIGS. 13–15. Row address, column addresses, individual segment column addresses, word selects, and data words, are shown. In FIG. 13, an example burst read for a segmented memory device of the present invention is illustrated. The column address and row address input to the memory device are shown. The column addresses that are applied by the multiplex circuitry to the individual memory array segments are also shown. The data access shown in FIG. 13 starts on a column boundary and thus generates no column address offset for any segment column address (all segments use column address). The first data transfer (word 0) accesses the first data word on the column page and therefore activates word select 0 (Wsel0) internal to the memory device to access memory array segment 0. The second data transfer accesses the first data word on the column page and therefore activates word select 1 to access memory array segment 1. The third data transfer in FIG. 13 activates word select 2, and the fourth data transfer activates word select 3.

Shown in FIG. 14 is an example data transfer for a segmented memory device of the present invention. The column addresses that are applied to the individual memory array segments are shown. The data access starts at the third array segment. That is, the third data word in a four data word page is read first. As such, segments 0 and 1 receive a column address that is incremented by one column address over the input column address. Segments 2 and 3 receive the input column address.

The first data transfer (word 2) accesses the third data word on the column page and therefore activates word select 2 to access memory array segment 2. The second data transfer accesses the fourth data word on the column page and therefore activates word select 3 to access memory array segment 3. After the second word output, the prior art requires a wait state to access the next column page. Because the memory device has routed column address+1 to segments 0 and 1, a wait state is not required. The third data transfer, therefore, activates word select 0. The fourth data transfer 486 activates word select 2.

Referring to FIG. 15, an example burst read that crosses a row boundary is described. The column address and row address input to the memory device containing the segmented memory array are shown. The column addresses that are applied to the individual memory array segments are also shown. The data access starts on the third segment of a four-segment array. As such, segments 3 and 4 receive the externally provided column address while segments 0 and 1 receive the incremented address. The first data transfer (word 2) accesses a data word by activating word select 2 to access memory array segment 2. The second data transfer accesses a data word by activating word select 3 to access memory array segment 3. A new row address and column address is provided to move to the next row of the memory array. During the access time for the new row, the data output does not change. Because the read begins at the start of the next page, all segments are coupled to the new column address. That is, none of the array segments receive an incremented column address.

Conclusion

An improved memory device has been detailed that helps eliminate wait states for crossing page boundaries. The memory device employs a segmented memory array that routes column address and column address+1 to all segments. In one embodiment, the final array segment does not receive an incremented column address. The memory address circuitry allows data read operations to begin at different memory array segments and cross page boundaries without requiring a wait state. The memory includes two address circuits to provide first and second column addresses. The second column address is incremented from the first column address. The memory routes one of the two column addresses to column decode circuitry for each memory array segment based on the start location of a read operation. The memory, therefore, allows multiple array segments to couple different columns to sense circuitry at the same time.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof

What is claimed is:

1. A memory device comprising:
   a memory array with an X and a Y dimension with a plurality of array partitions;
   a first address circuit;
   a second address circuit, wherein the first and second address circuits both address the Y dimension in the plurality of partitions of the memory array; and
   a control circuit to independently couple either the first address circuit or the second address circuit to each of the plurality of array partitions.

2. A non-volatile memory device, comprising:
   a memory array with an X and a Y dimension with a plurality of array partitions;
   a first address circuit;
   a second address circuit, wherein the first and second address circuits both address the Y dimension in the plurality of partitions of the memory array; and
   a control circuit to independently couple either the first address circuit or the second address circuit to each of the plurality of array partitions.

3. A memory device comprising:
   a memory array with a plurality of array partitions;
   a first address circuit;
   a second address circuit; and
   a control circuit to independently couple either the first address circuit or the second address circuit to each of the plurality of array partitions, wherein an address value contained in the second address circuit is generated from an address output of the first address circuit.

4. A memory device, comprising:

a memory array with a plurality of array partitions;

a first address circuit;

a second address circuit; and a control circuit to independently couple either the first address circuit or the second address circuit to each of the plurality of array partitions, wherein an address value contained in the second address circuit is generated by incrementing an address output of the first address circuit.

5. The memory device of claim 1, wherein each of the memory array partitions is coupled to one of a plurality of sense amplifiers.

6. The memory device of claim 1, wherein each of the memory array partitions is coupled to a data word select circuit.

7. A memory device comprising:

a memory array with a plurality of divisions;

a row address circuit;

a first column address circuit to provide a first address output;

a second column address circuit to provide a second differing address output;

a plurality of column decode circuits; and a control circuit to selectively couple either the first column address circuit or the second column address circuit to the individual column decode circuits.

8. A memory device comprising:

a memory array with a plurality of divisions;

a row address circuit;

a first column address circuit to provide a first address output;

a second column address circuit to provide a second address output;

a plurality of column decode circuits; and a control circuit to selectively couple either the first column address circuit or the second column address circuit to the individual column decode circuits, wherein the memory device comprises a non-volatile memory device.

9. A memory device comprising:

a memory array with a plurality of divisions;

a row address circuit;

a first column address circuit to provide a first address output;

a second column address circuit to provide a second address output;

a plurality of column decode circuits; and a control circuit to selectively couple either the first column address circuit or the second column address circuit to the individual column decode circuits, wherein an address value contained in the second address output is generated from the first address output.

10. The memory device of claim 9, wherein the second address output is one column address greater than the first address output.

11. A memory device comprising:

a memory array with a plurality of divisions;

a row address circuit;

a first column address circuit to provide a first address output;

a second column address circuit to provide a second address output;

a plurality of column decode circuits; and a control circuit to selectively couple either the first column address circuit or the second column address circuit to the individual column decode circuits, wherein each column address circuit further includes a data word address circuit.

12. A memory device comprising:

a memory array with a plurality of divisions;

a row address circuit;

a first column address circuit to provide a first address output;

a second column address circuit to provide a second address output;

a plurality of column decode circuits; and a control circuit to selectively couple either the first column address circuit or the second column address circuit to the individual column decode circuits, wherein each of the column decode circuits coupled to one of a plurality of sense amplifiers.

13. A memory device comprising:

a memory array with a plurality of divisions;

a row address circuit;

a first column address circuit to provide a first address output;

a second column address circuit to provide a second address output;

a plurality of column decode circuits; and a control circuit to selectively couple either the first column address circuit or the second column address circuit to the individual column decode circuits, wherein each of the memory array divisions is coupled to a data word select circuit.

14. The memory device of claim 13, wherein the control circuit couples the first column address circuit and the second column address circuit to the individual column decode circuits in response to the data word select circuit.

15. A memory device comprising:

a memory array with a plurality of addressable segments;

a row address circuit;

a plurality of column address circuits to provide a plurality of differing column addresses; and a control circuit that selectively couples an individual column address of the plurality of column addresses to each of the plurality of memory array segments.

16. A memory device comprising:

a memory array with a plurality of addressable segments;

a row address circuit;

a plurality of column address circuits to provide a plurality of column addresses; and a control circuit that selectively couples one of the plurality of column addresses to each of the plurality of memory array segments, wherein the memory array comprises floating gate memory cells.

17. The memory device of claim 15, wherein a first column address circuit receives a column address on an external address connection.

18. A memory device, comprising:

a memory array with a plurality of addressable segments;

a row address circuit;

a plurality of column address circuits to provide a plurality of differing column addresses, wherein a first column address circuit receives a column address on an external address connection and wherein an address value contained in each of the remaining column address circuits of the plurality of column address circuits is generated from the address value contained in the first column address circuit; and a control circuit that selectively couples an individual column address of the plurality of column addresses to each of the plurality of memory array segments.

19. A memory device comprising:

a memory array with a plurality of addressable segments;

a row address circuit;

a plurality of column address circuits to provide a plurality of column addresses;

a control circuit that selectively couples one of the plurality of column addresses to each of the plurality of memory array segments;

wherein a first column address circuit receives a column address on an external address connection;

wherein an address value contained in each of the remaining column address circuits of the plurality of column address circuits is generated from the address value contained in the first column address circuit; and wherein the address value contained in the first column address circuit is incremented to generate the address value contained in each of the remaining column address circuits of the plurality of column address circuits.

20. The memory device of claim 15, wherein each of the plurality of addressable segments is coupled to a corresponding sense amplifier.

21. The memory device of claim 15, wherein each of the plurality of addressable segments is coupled to a data select circuit.

22. A flash memory device comprising:

a memory array with a plurality of segments;

a row address circuit;

a first column address circuit to provide a first column address;

a second column address circuit to provide a second column address;

an individual column decode circuit coupled to each memory array segment; and a control circuit coupled to the first column address circuit, the second address circuit, and to each column decode circuit, wherein the control circuit selectively couples the first column address or the second column address to each column decode circuit.

23. The memory device of claim 22, wherein a first column address circuit receives an externally provided column address.

24. The memory device of claim 23, wherein the second column address is generated from the first column address.

25. The memory device of claim 24, wherein the first column address is incremented to generate the second column address.

26. The memory device of claim 22, wherein each of the plurality of memory array segments is coupled to a data select circuit.

27. The memory device of claim 26, wherein the control circuit controls the data select circuit and the first and second column address circuits to the column decode circuits in response to a data read start address.

28. A method to access a partitioned memory array comprising:

acquiring a first memory address;

generating a second memory address;

determining an address that is required by each of the individual memory array partitions; and coupling either the first memory address or the second memory address to the individual memory array segments.

29. The method of claim 28, wherein the segmented memory device comprises a non-volatile memory device.

30. The method of claim 28, wherein the second memory address is generated from the first memory address.

31. The method of claim 30, wherein the first memory address is incremented to generate the second memory address.

32. The method of claim 28, further comprising coupling each of the memory array partitions to one of a plurality of sense amplifiers.

33. The method of claim 28, further comprising coupling each of the memory array partitions to a data select circuit.

34. The method of claim 28, wherein determining which addresses are required is based upon a start address of a read operation.

35. A method to access a partitioned memory array comprising:

acquiring a row address;

acquiring a first column address;

generating a second column address; and selectively coupling the first column address or the second column address to the individual memory array partitions.

36. The method of claim 35, wherein the memory device comprises a non-volatile memory device.

37. The method of claim 35, wherein the second column address is generated from the first column address.

38. The method of claim 37, wherein the second column address is one column address greater than the first column address.

39. The method of claim 35, wherein each column address further includes a data word address.

40. The method of claim 35, wherein selectively coupling is controlled in response to the data word address.

41. The method of claim 35, further comprises coupling a column decode circuit to each memory array partition.

42. The method of claim 35, further comprises coupling one of a plurality of sense amplifiers to each memory array partition.

43. The method of claim 35, further comprises coupling each of the memory array partitions to a data word select circuit.

44. The method of claim 43, wherein coupling the first column address and the second column address to the individual memory array partitions is performed in response to the data word select circuit.

45. A method for accessing a segmented memory array comprising:

acquiring a row address;

acquiring a plurality of differing column addresses; and simultaneously coupling individual column addresses of the plurality of column addresses selectively to the segments of the memory array.

46. The method of claim 45, further comprises receiving a first column address on an external address connection.

47. A method for accessing a segmented memory array, comprising:

acquiring a row address;

receiving a first column address of a plurality of column addresses on an external address connection;

generating each of the remaining column addresses of the plurality of column addresses from the first column address; and simultaneously coupling individual column addresses of the plurality of column addresses selectively to the segments of the memory array.

48. A method for accessing a segmented memory array comprising:

acquiring a row address;

acquiring a plurality of column addresses;

simultaneously coupling the plurality of column addresses selectively to the segments of the memory array;

receiving a first column address on an external address connection;

generating each of the remaining column addresses of the plurality of column addresses from the first column address; and generating each of the remaining column address of the plurality of column addresses by incrementing the first column address.

49. A column select circuit for a segmented memory array comprising:

a column decode circuit coupled to a segment of a memory array; and a control circuit coupled to the column decode circuit, receiving a first and second differing column address, wherein the control circuit selectively couples either the first or second column address to the column decode circuit.

50. The column select circuit of claim 49, wherein the memory array is a non-volatile memory array.

51. The column select circuit of claim 49, wherein the first column address is received on an external address connection.

52. A column select circuit for a segmented memory array comprising:

a column decode circuit coupled to a segment of a memory array; and a control circuit coupled to the column decode circuit, receiving a first and second column address, wherein the second column address is one column address greater than the first column address.

53. The column select circuit of claim 49, wherein the control circuit selectively couples either the first or second column address to the column decode circuit.

54. A column select circuit for a segmented memory array comprising:

a column decode circuit coupled to a segment of a memory array; and a control circuit coupled to the column decode circuit, receiving a first and second column address;

wherein the control circuit selectively couples either the first or second column address to the column decode circuit; and wherein the coupling of the first or second column address is based on the starting address of the data word being accessed.

55. A column select circuit for a segmented memory array comprising:

a column decode circuit coupled to a segment of a memory array; and a control circuit coupled to the column decode circuit, receiving a first and second column address, wherein the control circuit comprises:

a control state machine; and a multiplexer circuit.

56. A memory system comprising:

an external processor; and a non-volatile memory coupled to the external processor, the non-volatile memory comprises, a memory array with a plurality of segments, a row address circuit, a first column address circuit to provide a first address output, a second column address circuit to provide a second address output, a plurality of column decode circuits, and a control circuit to selectively couple either the first column address circuit or the second column address circuit to the individual column decode circuits.

57. The memory system of claim 56, wherein the column decode circuits comprise:

a decode circuit; and a plurality of pass transistor that are activated in response to the decode circuit.

58. The memory system of claim 56, wherein the control circuit comprises:

a mulitplexer circuit; and a control state machine.

59. The memory system of claim 56, wherein the column address circuits further comprise a column address counter circuit.

60. A method of operating a memory system comprising:

coupling a segmented non-volatile memory to an external processor;

providing a row address from the processor to the non-volatile memory;

providing a first column address from the processor to the non-volatile memory;

generating a second column address based on the first column address; and selectively coupling either the first column address or the second column address to individual memory array segments.

61. The method of claim 60, wherein the coupling of the first column address or the second column address uses a multiplex circuit.

62. The method of claim 61, further comprising controlling a column decode circuit with the output of the multiplex circuit.

63. A memory device comprising:

a memory array with a plurality of segments;

a row address circuit;

a first column address circuit to provide a first address output;

a second column address circuit to provide a second address output; and a plurality of column decode circuits, wherein the first address output is coupled to at least one of the plurality of column decode circuits and the second address output is coupled the remainder of the column decode circuits.

64. The column select circuit of claim 63, wherein the memory device is non-volatile memory.

65. The column select circuit of claim 63, wherein the first column address circuit receives an externally provided column address.

66. The column select circuit of claim 63, wherein the second address output is one column address greater than the first address output.

67. The column select circuit of claim 63, wherein the column decode circuits are coupled to a multiplexer circuit.

68. The column select circuit of claim 67, wherein the multiplexer circuit is coupled to the first address output and the second address output.

69. The column select circuit of claim 68, wherein the multiplexer circuit is controlled to selectively couple the first and second address outputs to the plurality of column decode circuits.

70. A method of operating a non-volatile memory device comprising:
   obtaining a row address;
   asserting the row address to a row address decoder to select a row of memory cells in a memory array, wherein the memory array is divided into a plurality of segments of floating gate memory cells arranged in columns with bit lines;
   receiving an externally provided first column address;
   generating a second column address from the first column address by incrementing the first column address;
   coupling the first column address and second column address to a column address multiplexer circuit;
   using the column address multiplexer circuit, coupling either the first column address or the second column address selectively to each of a plurality of column address decoder circuits;
   using the column address decoder, selecting a plurality of bit lines per segment wherein the plurality of bit lines per segment provide a data word;
   sensing the data words with sense amplifier circuitry;
   receiving an externally provided word address; and
   selecting one of the data word from the sense amplifier circuitry in response to with the word address.

71. A non-volatile memory device comprising:
   a memory array divided into a plurality of segments of floating gate memory cells arranged in columns with bit lines;
   a row address decode circuit coupled to the memory array to receive a row address;
   a row select circuit coupled to the row address decode circuit to select a row of the memory array;
   a column decode circuit coupled to each memory array segment to select a plurality of bit lines per segment wherein the plurality of bit lines per segment provide word data;
   a column address multiplexer circuit coupled to each column decode circuit;
   a column address circuit to receive a column address is coupled to each column mulitplexer circuit to provide a first column address;
   a column address counter circuit to provide a second column address, wherein the second column address is generated by incrementing the first column address;
   sense amplifier circuitry coupled to the column decode circuit to detect the data word per segment;
   a word multiplexer circuit coupled to the sense amplifier circuitry to output the detected data words to an output buffer;
   a word address circuit coupled to receive an externally provided word address; and
   a control circuit coupled to the word address circuit, the column address circuit, and the column address multiplexers to control an output of the column address multiplexers in response to the word address.

72. A non-volatile memory device comprising:
   a memory array with a plurality of segments;
   a column decode circuit coupled to a plurality of bit lines of the memory array;
   an address decode circuit to receive an external column address;
   a column address counter circuit to provide an internal column address; and
   a multiplexer circuit to receive outputs from both the address decode circuit and the column address counter circuit, wherein the output of the multiplexer circuit is coupled to the column decode circuit, and
   where the multiplexer is controlled in response to an externally provided segment starting address.

73. The non-volatile memory device of claim 72, wherein the column decode circuit further comprises a plurality of pass transistors.

74. The non-volatile memory device of claim 72, wherein the memory array segments comprise segments 0 to X, where the segment start address is Y, where Y is between 0 and X, wherein the multiplexer circuit couples an output of the column address counter to segments 0 to Y−1 and couples an output of the address decode circuit to segments Y to X.

75. A memory device comprising:
   a memory array with a plurality of array partitions;
   a first column address circuit to provide a first column address;
   a second column address circuit to provide a second differing column address; and
   a control circuit to independently couple either the first column address circuit or the second column address circuit to each of the plurality of array partitions.

76. A non-volatile memory device, comprising:
   a memory array with a plurality of array partitions;
   a first column address circuit to provide a first column address;
   a second column address circuit to provide a second differing column address; and
   a control circuit to independently couple either the first column address circuit or the second column address circuit to each of the plurality of array partitions.

77. A memory device, comprising:
   a memory array with a plurality of array partitions;
   a first column address circuit to provide a first column address;
   a second column address circuit to provide a second differing column address, wherein an address value contained in the second column address circuit is generated from an address output of the first column address circuit; and
   a control circuit to independently couple either the first column address circuit or the second column address circuit to each of the plurality of array partitions.

78. The memory device of claim 77, wherein the address value output by the first column address circuit is incremented to generate the address value contained in the second column address circuit.

79. The memory device of claim 75, wherein each of the memory array partitions is coupled to one of a plurality of sense amplifiers.

80. The memory device of claim 75, wherein each of the memory array partitions is coupled to a data word select circuit.

* * * * *